United States Patent
Davies et al.

[11] Patent Number: 5,901,041
[45] Date of Patent: May 4, 1999

[54] FLEXIBLE INTEGRATED CIRCUIT PACKAGE

[75] Inventors: Bill Tempest Davies, Kananta; Mark Roy Harris, Woodlawn, both of Canada

[73] Assignee: Northern Telecom Limited, Montreal, Canada

[21] Appl. No.: 08/982,506

[22] Filed: Dec. 2, 1997

[51] Int. Cl.$^6$ .................................. H05K 7/20; H05K 1/00
[52] U.S. Cl. .................. 361/704; 174/16.3; 174/52.4; 174/260; 257/707; 257/713; 257/719; 257/738; 257/723; 361/720; 361/760; 361/772; 361/773
[58] Field of Search .................................. 174/16.3, 52.4, 174/138 G, 260; 257/706–707, 712–713, 718–719, 723, 738, 778, 780, 787; 361/704, 707, 717–722, 749, 773, 774, 760; 438/108, 122, 125–126, 613

[56] References Cited

U.S. PATENT DOCUMENTS

| | | | |
|---|---|---|---|
| 4,771,330 | 9/1988 | Long | 357/80 |
| 5,045,921 | 9/1991 | Lin et al. | 257/778 |
| 5,222,014 | 6/1993 | Lin | 257/773 |
| 5,239,198 | 8/1993 | Lin et al. | 257/787 |
| 5,477,082 | 12/1995 | Bucky, III et al. | 257/778 |
| 5,646,828 | 7/1997 | Degani et al. | 361/722 |
| 5,834,848 | 11/1998 | Iwasaki | 257/778 |

FOREIGN PATENT DOCUMENTS

| | | |
|---|---|---|
| 8242054 | 9/1996 | Japan . |
| 982763 | 3/1997 | Japan . |
| WO8806348 | 8/1988 | WIPO . |

OTHER PUBLICATIONS

Dr. F.E. Andros, Dr. R.B. Hammer; "Area Array Tab Package Technology"; presented by IBM, pp. 1 to 8 No Known Date.

Primary Examiner—Gregory Thompson

[57] ABSTRACT

A flexible integrated circuit package for mounting on a substrate is disclosed. The package consists of a tape film having layers of dielectric and conductive material, a semiconductor die and an array of conductive leads. A molded body covers the die, and absorbs the majority of the pressure applied when compressing the package between a heatsink and a printed circuit board (PCB). Rigid removable support material surrounds the molded body to keep the package flat while it is being mounted to the PCB. The support material is removed after soldering of the package to the PCB. The invention permits the package to be tightly compressed between a heatsink and a substrate without causing degradation of the conductive connections. Reliability of the connections is further increased since the tape film is flexible enough to accommodate bending of the substrate to which the package is connected.

29 Claims, 3 Drawing Sheets

FLEXIBLE INTEGRATED CIRCUIT PACKAGE

FIELD OF THE INVENTION

This invention relates to integrated circuit packages in general, and specifically to integrated circuit packages designed to be clamped between a heatsink and a substrate such as a printed circuit board.

BACKGROUND OF THE INVENTION

In the manufacture of semiconductor devices, an important aspect is the production of integrated circuit (IC) packages so that heat generated by the package can be dissipated efficiently. Another important aspect is the ability to mount a large number of conductive leads onto the package without decreasing its reliability.

A package will generally have an upper part which dissipates a majority of the heat generated and a lower part consisting of an array of conductive leads for connection to a substrate such as a printed circuit board (PCB), usually of larger area. A conventional approach in assisting the efficient dissipation of heat is to lay a piece of thermally conductive material, known in the art as a heatsink, onto the upper part of the package and clamp it to the substrate underneath the package. The efficiency with which heat is removed from the package, known as the thermal performance, is directly proportional to the pressure applied at the heatsink-package interface, and therefore a desirable arrangement will require the application of substantial pressure at this interface. Since the package is compressed between the heatsink and the substrate, pressure will also be applied to the interface where the package and substrate meet.

Generally, the heatsink and the upper part of the package are made of robust material such that a substantially large amount of pressure may be applied without causing damage to the interfacing components. However, despite any robustness in the substrate material, the conductive leads at the package-substrate junction cannot withstand a highly compressive load without degrading the connection between the leads and the substrate. The conductive leads of a more rigid, conventional package also wear out due to twisting and bending of the printed circuit board substrate during handling and operation.

Among the relevant prior art is a so-called Area Array Tape Automated Bonding, or ATAB, package developed by IBM Corporation. It consists of a semiconductor die mounted on a tape film comprising several layers each of conductive (copper) and polyimide dielectric (Upilex™) material. Circular electrical vias are mechanically punched in the tape film. Electrical continuity is maintained by a copper circuit through the conductive layers and the electrical vias. The lower part of the package comprises an array of tin-lead alloy solder balls to be soldered onto a printed circuit board.

Stiffener material is attached onto the tape film surrounding the die and is flush with it. Due to the presence of the stiffener, the package lends itself well to enhancement of thermal performance. With the plane of the stiffener and die being the same, a heatsink can be bonded directly to the top of the die. However, the allowable compressive load on the ATAB package is determined by the long term load that the package-substrate interface (i.e. the solder ball interconnects) can support; therefore the amount of heat that can be removed from the package is significantly limited. Furthermore, the ATAB package is rigid in all three axes, thereby limiting the number of interconnects that can reliably connect the package to a substrate.

SUMMARY OF THE INVENTION

It is an object of the present invention to provide an improved integrated circuit package and method of connecting an integrated circuit package to a substrate in which one or more of the disadvantages of the prior art is obviated or mitigated.

Therefore, the invention may be summarized according to a first broad aspect as an integrated circuit package for mounting on a substrate, comprising a flexible tape film consisting of at least one layer of dielectric material and at least one layer of conductive material, the tape film having a top surface and a bottom surface; a semiconductor die mounted either on or adjacent the top surface or on or adjacent the bottom surface of the tape film for connection to the substrate; a plurality of conductive leads of finite thickness mounted on the bottom surface of the tape film, the conductive leads being electrically connected through the at least one layer of conductive material to the semiconductor die; a molded body divided by the tape film into an upper molded body and a lower molded body, one of which covers the semiconductor die; and rigid removable support material surrounding the upper molded body and bonded to the top surface of the tape film.

In the preferred embodiment, the package further comprises a heat spreader mounted either on or adjacent the top surface of the tape film, or on or adjacent the semiconductor die. The preferred embodiment of the package also comprises at least one clearance hole punched in the tape film, permitting the package to be easily clamped between a heatsink and a substrate. The package may comprise thermal vias that conduct heat from the upper or lower molded body covering the semiconductor die to the upper or lower molded body not covering the semiconductor die. Electrical vias through the tape film connect pairs of conductive layers.

The invention may be summarized according to a second broad aspect as a method of connecting an integrated circuit package to a substrate, the package comprising a flexible tape film consisting of at least one layer of dielectric material and at least one layer of conductive material, the tape film having a top surface and a bottom surface; a semiconductor die mounted either on or adjacent the top surface or on or adjacent the bottom surface of the tape film for connection to the substrate; a plurality of conductive leads of finite thickness mounted on the bottom surface of the tape film, the conductive leads being electrically connected through the at least one layer of conductive material to the semiconductor die; a molded body divided by the tape film into an upper molded body and a lower molded body, one of which covers the semiconductor die; and rigid removable support material surrounding the upper molded body and bonded to the top surface of the tape film, the method comprising soldering the conductive leads to the substrate; removing the support material; and laying a heatsink onto the upper molded body.

An advantage of this invention is that it permits the package to be very tightly compressed between a heatsink and a substrate without causing degradation of the connection between the leads and the substrate. A further advantage of the present invention is that bending of the substrate to which the package finds itself connected will not cause the connection to wear out, as the tape film is flexible enough to accommodate contortions that may be applied to the conductive leads underneath. Consequently, a large number of conductive leads may be mounted to the tape film without reducing the reliability of the package.

BRIEF DESCRIPTION OF THE DRAWINGS

A preferred embodiment of the invention will now be described with reference to the attached drawings in which.

DETAILED DESCRIPTION OF THE PREFERRED EMBODIMENT

Figure 1:
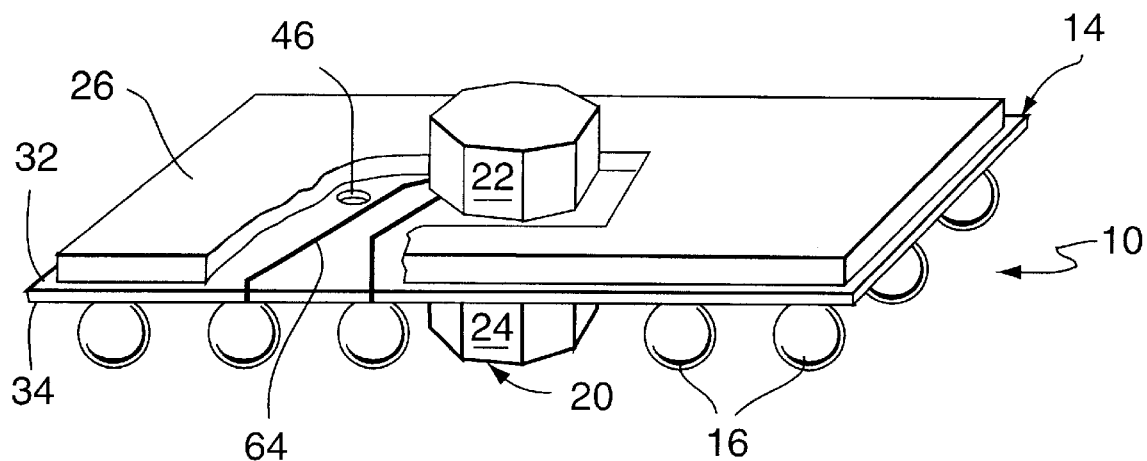
FIG. 1 is a perspective view of an integrated circuit package prior to connection with a substrate, in accordance with the preferred embodiment of the present invention.
Figure 2:
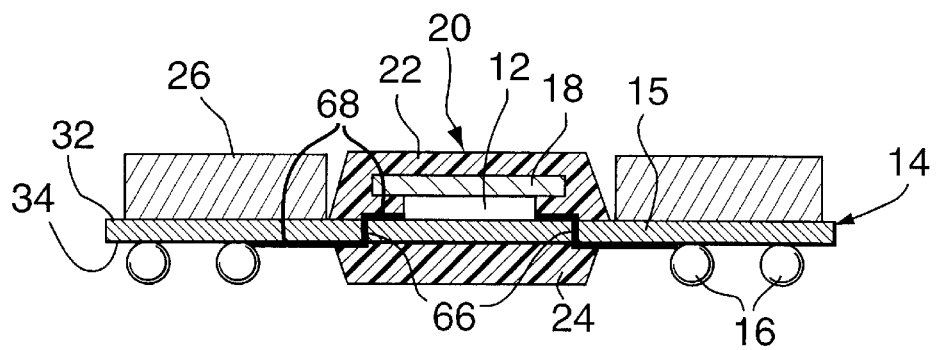
FIG. 2 is a cross-sectional view of the package of FIG. 1.

FIGS. 1 and 2 depict a package 10 which includes a flexible tape film 14 consisting of one or more layers 15 of flexible polyimide dielectric material such as Upilex™ or Kapton™ and two conductive layers 68 made of a material such as copper. The conductive layers 68 need not span the entire tape film 14, but may be arranged in conductive paths or traces (64, shown in FIG. 1) electrically connected to each other on either side of the tape film 14 by conductive electrical vias (66, shown in FIG. 2). In the preferred embodiment, two clearance holes 46 (only one shown in FIG. 1), strategically located so as not to interfere with the conductive paths 64, are punched in the tape film 14 to allow easy installation of a clamping mechanism once the package 10 is connected to a substrate. It is understood that the invention will work equally well with more than two clearance holes, with only one clearance hole, or without clearance holes altogether.

The tape film 14 is identified as having a top surface 32 and a bottom surface 34. As shown in FIG. 2, a semiconductor die 12 is attached at a central location to the top surface 32. Any of a number of suitable methods used in the art, e.g. flip-chip, tape automated bonding (TAB) or wire bonding can be used to connect the semiconductor die 12 to the tape film 14. In fact, the semiconductor die 12 could similarly be attached to the bottom surface 34, as will become apparent when discussing alternate embodiments of the present invention in FIGS. 4 to 9. Preferably, a heat spreader 18 for removing excess heat from the package 10 is laid upon the semiconductor die 12. Again, alternate embodiments exist in which the heat spreader is placed differently, or in which the heat spreader 18 is not required.

Still referring to FIGS. 1 and 2, the package further comprises a molded body 20, preferably made of epoxy resin, which is split by the tape film 14 into an upper molded body 22 with a flat top and a lower molded body 24 with a flat bottom. The upper molded body 22 and lower molded body 24 are respectively sealed to the top surface 32 and bottom surface 34 of the tape film 14. Advantageous compliant properties of the polyimide dielectric allow the molded body 20 to be molded onto either surface of the tape film 14 by a conventional transfer molding process and without damaging the conductive paths 64. Furthermore, prior to assembly of the package, the tape film 14 may comprise injection holes (not shown) which would cause both the upper and lower molded bodies 22,24 to form one integral piece of epoxy resin once molding is complete.

The upper molded body 22 surrounds the semiconductor die 12 and heat spreader 18. The flat bottom of the lower molded body 24 is generally in a same plane 90 as an array of conductive leads 16, arranged as an array of solder balls, for eventual connection of the package 10 to a substrate such as a PCB. The conductive leads 16 are joined electrically to the semiconductor die 12 by the conductive paths 64 etched in the conductive layers 68. Other interconnect styles as known in the art may be used in place of the array of solder balls; for example, perimeter leads used in gull wing surface mount technology.

A layer of rigid support material 26 is bonded with an adhesive (not shown) onto the top surface 32 of the tape film 14, without adversely affecting the conductive paths 64. In the preferred embodiment, the support material 26 will surround the upper molded body 22 so as to support and keep the tape film 14 flat during soldering of the solder balls 16 to a substrate. Without a "window frame" of support material, the package would not be flat enough during assembly and some leads might not solder to the substrate.

Ideally, the support material 26 is made of a soluble organic compound, such as Water Extendible Vinyl Ester Resin (WEVER™) manufactured by Dow Chemical Inc., that can be dissolved by rinsing the package in water following connection to a substrate. Support materials which are soluble in liquids other than water are also contemplated. Alternatively, the compound can be made of an arbitrary rigid material, connected to the tape film by an ultraviolet-sensitive glue whose adhesive properties are altered upon exposure to ultraviolet light, and which can thus be made to shed the support material 26 after installation. Still other embodiments may comprise support material adhering to the top surface of the tape film by means of a soluble glue which can similarly cause the package to shed the support material upon immersion in or rinsing with a solvent such as water.

Figure 3:
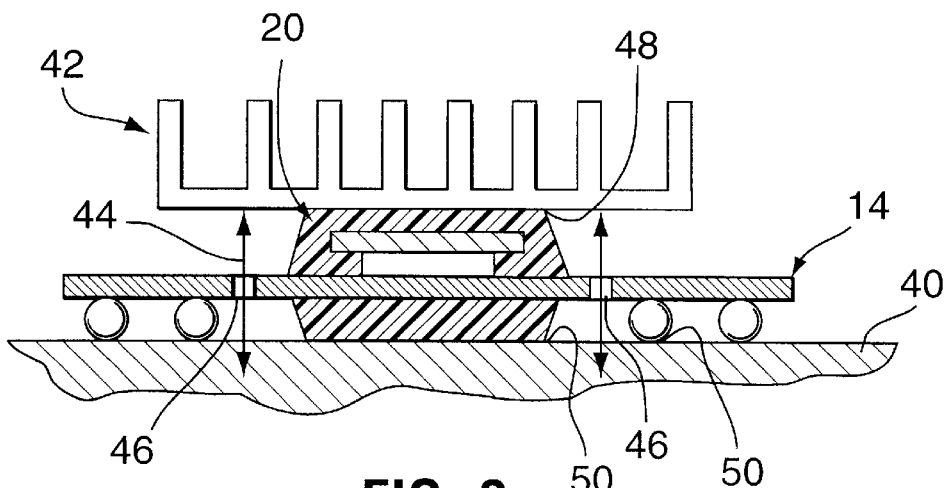
FIG. 3 is a cross-sectional view of the package of FIG. 1 after having been clamped between a heatsink and a printed circuit board, and after the support material has been removed.

In FIG. 3, the package 10 is shown connected to a printed circuit board (PCB) 40. A heatsink 42 with a flat bottom is laid on top of the upper molded body 22. The support material (26, shown in FIGS. 1 and 2) has been removed as per one of the previously discussed methods. A heatsink-package interface 48 and a package-substrate interface 50 can be identified. The heatsink-package interface is defined between the flat top of the upper molded body 22 and the flat bottom of the heatsink 42 while the package-substrate interface is defined partly between the flat bottom of the lower molded body and the PCB 40 and partly between the solder balls 16 and the PCB 40. A clamping mechanism 44 known per se and illustrated schematically protrudes through clearance holes (46, shown in phantom), extending into the PCB 40 at one end and through the heatsink 42 at the other. Screws, bolts, springs, or any of a variety of suitable mechanical fasteners are used to tighten the clamping mechanism and compress the package 10 between the heatsink 42 and the PCB 40.

In operation, it is desired to press heatsink 42 to the upper molded body 22 with enough pressure to achieve efficient heat dissipation. With the clamping mechanism of FIG. 3, this will result in large amounts of pressure being applied to the heatsink-package interface 48 and to the package-substrate interface 50.

As discussed previously, neither the upper part of the package nor the substrate is usually a source of failure under high pressure in traditional packages. It is at a point on the package-substrate interface, i.e. at the conductive leads, that a failure will often occur. In this inventive package, pressure on the conductive leads 16 is countered by a flex in the tape film 14, so that pressure applied to the package-substrate interface is absorbed mostly by the lower molded body 24. The effect is that efficient dissipation of heat is achieved without degrading the reliability of the conductive connection. The presence of a heat spreader 18 near the heatsink 42 assists in providing the illustrated embodiment with excellent thermal properties.

Although it is preferred that the lower molded body 24 be substantially the same thickness as the conductive leads 16 such that the flat bottom is substantially coplanar with the undersides of the leads 16, slight deviation in either direction can be accommodated by flexure of the tape film. Furthermore, the compliant nature of the tape reduces the need for the top and bottom surfaces to be parallel to each other. The slight sideways force generated during clamping will be absorbed in the tape layer in the same fashion that twisting a board does. The low modulus and thickness of the tape film result in a structure that, once the support material has been removed, is very compliant in all three axes.

Alternate embodiments of the present invention are now described with reference to FIGS. 4 through 9. All of the following embodiments share the presence of a flexible tape film having one layer of polyimide dielectric; a window frame of rigid support material; an array of solder balls; and upper and lower molded bodies respectively molded to the top and bottom surfaces of the tape film. As previously discussed, the lower molded body is preferably substantially the same thickness as the array of conductive leads but slight deviations in either sense can be accommodated without undermining the value or functionality of the present invention. It is also understood that two or more layers each of polyimide dielectric and conductive material may be required to form more complex conductive paths leading from each conductive lead to the semiconductor die.

Figure 4:
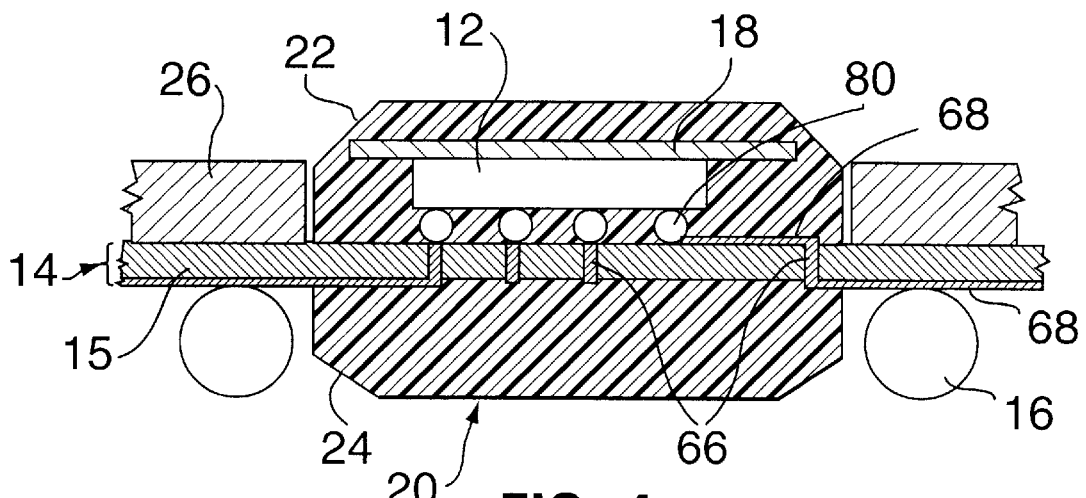
FIGS. 4 to 9 are detailed cross-sectional views of an integrated circuit package according to alternate embodiments of the present invention.

In FIG. 4 is shown a flip-chip setup, with the semiconductor die 12 mounted to the top surface 32 of tape film 14 by a set of flip-chip solder balls 80. The conductive layers 68 are joined by conductive electrical vias 66 and electrically connect the flip-chip solder balls 80 to the conductive leads 16. A thermal spreader 18 is mounted atop the semiconductor die 12 within the upper moulded body 22, resulting in a package with high thermal performance.

Figure 5:
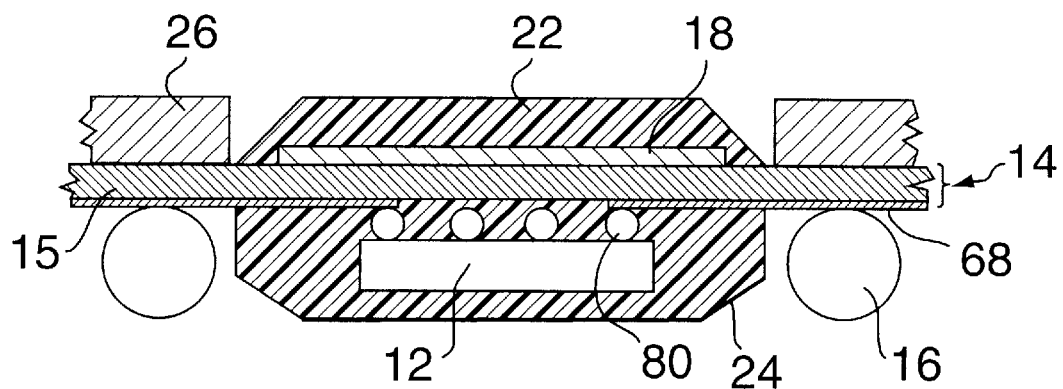

FIG. 5 shows another flip-chip arrangement wherein only one conductive layer 68 and no electrical vias are required. In this version, however, the semiconductor die 12 is mounted to the bottom surface of tape film 14 and is surrounded by the lower molded body 24. The thermal dissipation properties of this package would be poor if not for a heat spreader 18, mounted onto the top surface of tape film 14, rendering thermal performance moderate.

Figure 6:
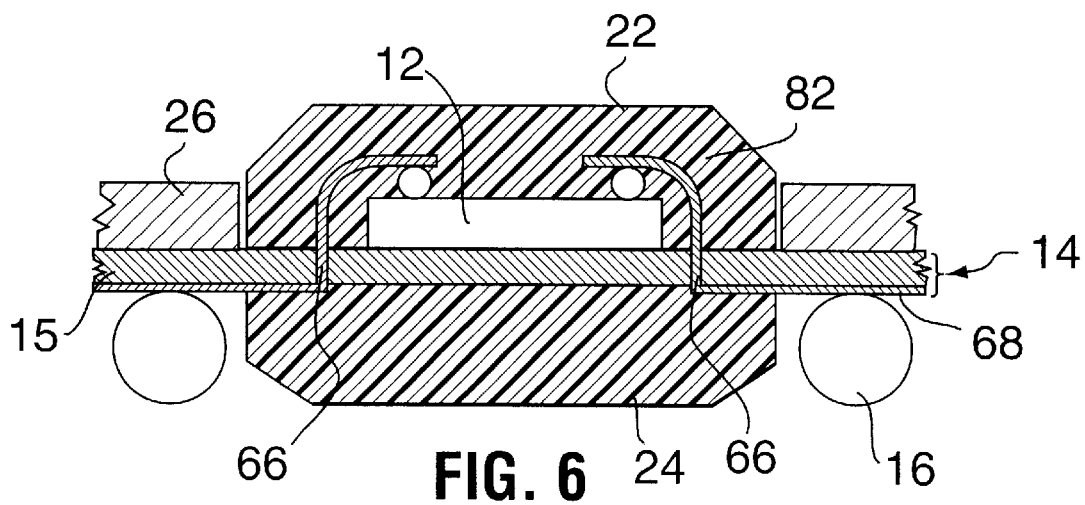

In FIG. 6, the semiconductor die 12 is attached upside-down onto the top surface of the tape film 14. Flip-chip solder balls have been replaced by wire bonds 82 electrically connecting the semiconductor die 12 (through electrical vias 66) to conductive paths on a single conductive layer 68 adjacent the bottom surface of tape film 14. No heat spreader is present, resulting in relatively poor thermal performance.

Figure 7:
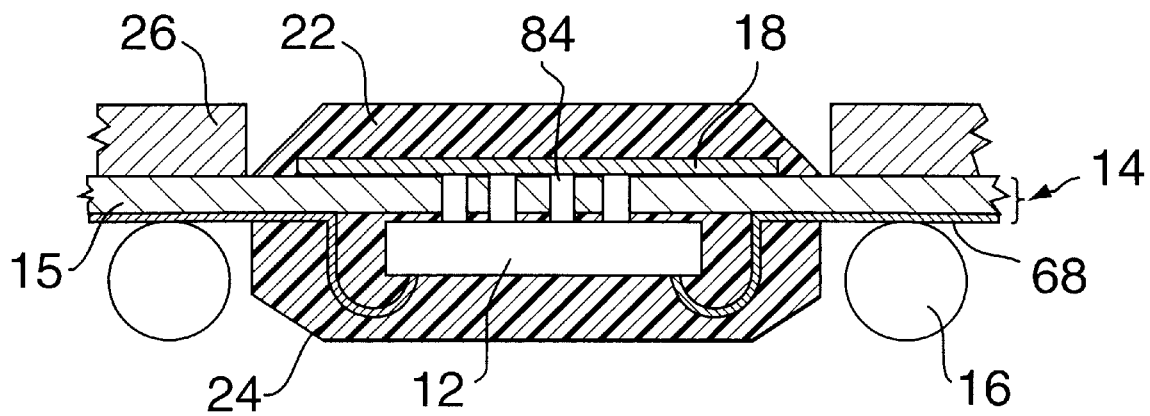

FIG. 7 depicts another wire bonded setup, this time with the semiconductor die mounted upside-down to the bottom surface of tape film 14. A heat spreader 18 is mounted to the top surface of tape film 14, and is thermally connected to the semiconductor die 12 by thermal vias 84 penetrating the tape film, resulting in moderate thermal performance of the integrated circuit package. It is noted that the package requires no more than one conductive layer 68; furthermore, no electrical vias are necessary.

Figure 8:
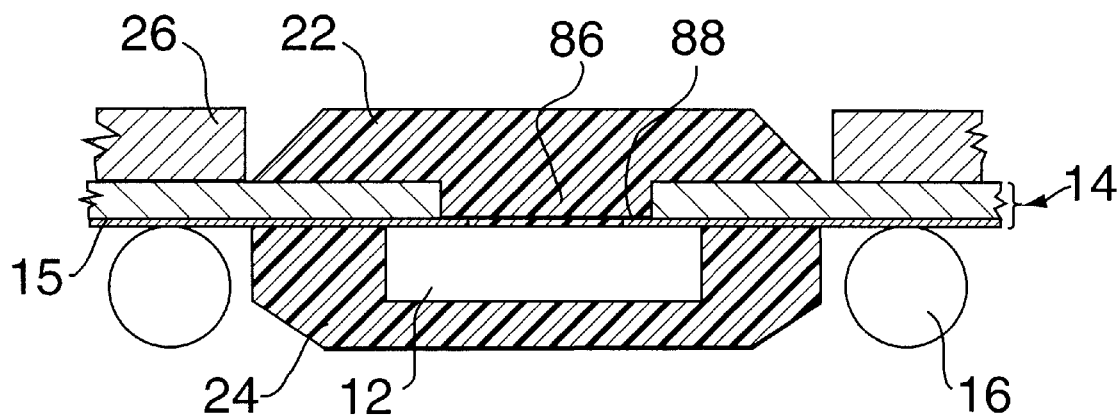

FIG. 8 illustrates a similar arrangement to the one in FIG. 5, except that an access window 86 is carved in the tape film 14 thereby allowing the semiconductor die 12 to be provided with TAB bonds 88. As will be apparent to one skilled in the art, thermal performance of this package will be poor due to the semiconductor die 12 being located underneath the tape film 14 and lack of a heat spreader.

Figure 9:
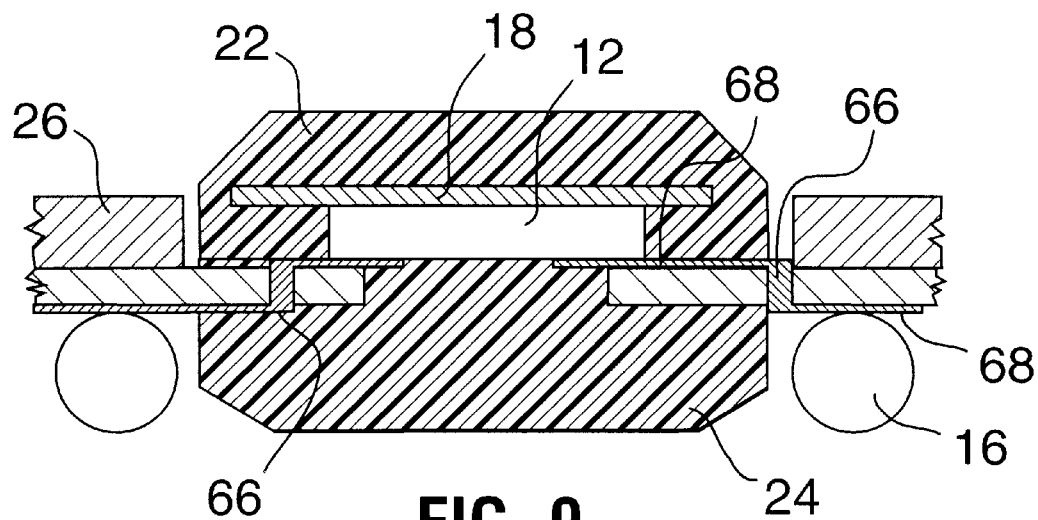
Figure 4:
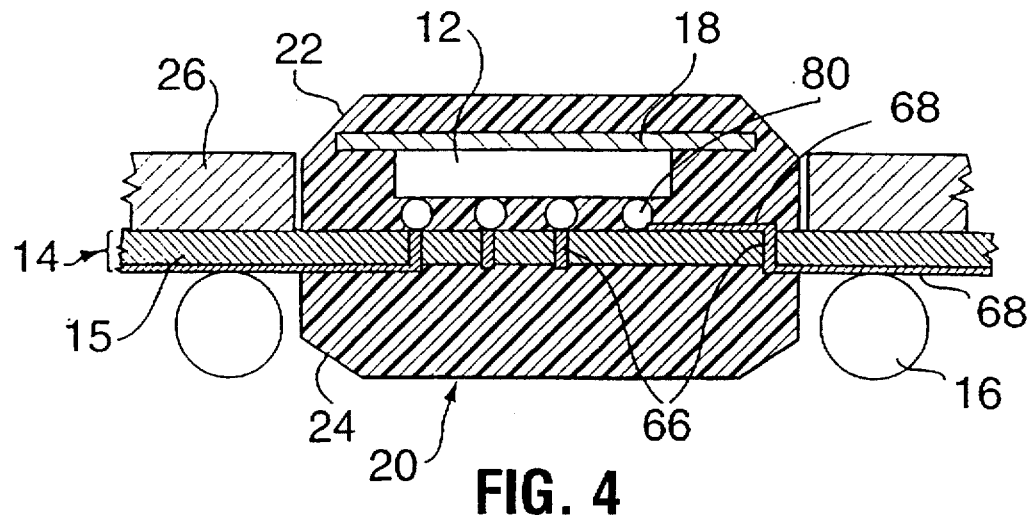
Figure 5:
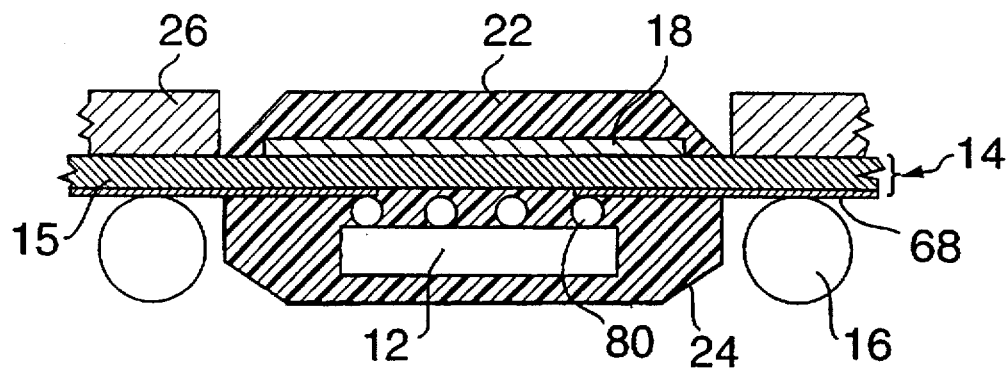
Figure 6:
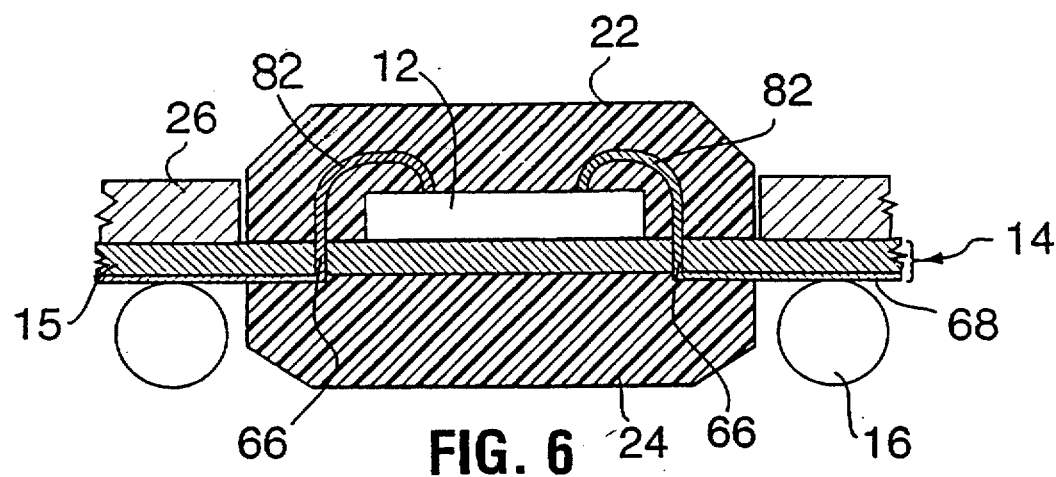

In contrast, FIG. 9 provides a TAB-mounted package offering high thermal performance, similar in many respects to the flip-chip arrangement in FIG. 4. In this variant of the present invention, two electrical vias 66 join conductive paths on each of two conductive layers 68.

While the preferred embodiment, in addition to several alternate forms, of the invention has been described and illustrated it will be apparent to one skilled in the art that further variations in the design may be made. The scope of the invention, therefore, is only to be limited by the claims appended hereto.

We claim:

1. An integrated circuit package for mounting on a substrate comprising:

a flexible tape film consisting of at least one layer of dielectric material and at least one layer of conductive material, the tape film having a top surface and a bottom surface;

a semiconductor die mounted either on or adjacent the top surface or on or adjacent the bottom surface of the tape film for connection to the substrate;

a plurality of conductive leads of finite thickness mounted on the bottom surface of the tape film, the conductive leads being electrically connected through the at least one layer of conductive material to the semiconductor die;

a molded body divided by the tape film into an upper molded body and a lower molded body, one of which covers the semiconductor die; and rigid removable support material surrounding the upper molded body and bonded to the top surface of the tape film.

2. An integrated circuit package according to claim 1, wherein the package further comprises a heat spreader mounted on or adjacent the top surface of the tape film.

3. An integrated circuit package according to claim 1, wherein the package further comprises a heat spreader mounted on or adjacent the semiconductor die.

4. An integrated circuit package according to claim 1, wherein the tape film further comprises at least one clearance hole.

5. An integrated circuit package according to claim 1, wherein the support material is soluble in liquid solvent.

6. An integrated circuit package according to claim 1, wherein the support material is water soluble.

7. An integrated circuit package according to claim 1, wherein the support material is connected to the tape film by an ultraviolet-sensitive glue.

8. An integrated circuit package according to claim 1, wherein the support material is connected to the tape film by a soluble glue.

9. An integrated circuit package according to claim 1, wherein the conductive leads form an array of solder balls.

10. An integrated circuit package according to claim 1, wherein the conductive leads form an array of gull wings.

11. An integrated circuit package according to claim 1, the tape film further comprising thermal vias that conduct heat from the upper or lower molded body covering the semiconductor die through to the upper or lower molded body not covering the semiconductor die.

12. An integrated circuit package according to claim 1, wherein there are at least two conductive layers which are electrically connected by electrical vias through the tape film.

13. An integrated circuit package according to claim 1, wherein the upper molded body has a flat top and the lower molded body has a flat bottom.

14. An integrated circuit package according to claim 12, wherein the lower molded body has a thickness substantially equal to the thickness of the conductive leads.

15. An integrated circuit package according to claim 5, wherein the upper molded body has a flat top and the lower molded body has a flat bottom.

16. An integrated circuit package according to claim 6, wherein the upper molded body has a flat top and the lower molded body has a flat bottom.

17. An integrated circuit package according to claim 7, wherein the upper molded body has a flat top and the lower molded body has a flat bottom.

18. An integrated circuit package according to claim 8, wherein the upper molded body has a flat top and the lower molded body has a flat bottom.

19. An integrated circuit package according to claim 1, wherein the lower molded body has a thickness substantially equal to the thickness of the conductive leads.

20. An integrated circuit package according to claim 15, wherein the lower molded body has a thickness substantially equal to the thickness of the conductive leads.

21. An integrated circuit package according to claim 16, wherein the lower molded body has a thickness substantially equal to the thickness of the conductive leads.

22. An integrated circuit package according to claim 17, wherein the lower molded body has a thickness substantially equal to the thickness of the conductive leads.

23. An integrated circuit package according to claim 18, wherein the lower molded body has a thickness substantially equal to the thickness of the conductive leads.

24. A method of connecting an integrated circuit package to a substrate, the package comprising a flexible tape film consisting of at least one layer of dielectric material and at least one layer of conductive material, the tape film having a top surface and a bottom surface; a semiconductor die mounted either on or adjacent the top surface or on or adjacent the bottom surface of the tape film for connection to the substrate; a plurality of conductive leads of finite thickness mounted on the bottom surface of the tape film, the conductive leads being electrically connected through the at least one layer of conductive material to the semiconductor die; a molded body divided by the tape film into an upper molded body and a lower molded body, one of which covers the semiconductor die; and rigid removable support material surrounding the upper molded body and bonded to the top surface of the tape film, the method comprising:

soldering the conductive leads to the substrate;

removing the support material; and laying a heatsink onto the upper molded body.

25. A method of connecting an integrated circuit package to a substrate according to claim 24, wherein the support material is water soluble and removal of the support material is achieved by rinsing the package with water.

26. A method of connecting an integrated circuit package to a substrate according to claim 24, wherein the support material is connected to the tape film by an ultraviolet-sensitive glue and removal of the support material is achieved by exposing the package to ultraviolet light.

27. A method of connecting an integrated circuit package to a substrate according to claim 24, wherein the support material is connected to the tape film by a soluble glue and removal of the support material is achieved by immersing the package in a solvent.

28. A method of connecting an integrated circuit package to a substrate according to claim 24, the method further comprising compressing the package between the heatsink and the substrate by a clamping mechanism.

29. A method of connecting an integrated circuit package to a substrate according to claim 28, wherein the tape film further comprises clearance holes for attachment of the clamping mechanism.

\* \* \* \* \*

UNITED STATES PATENT AND TRADEMARK OFFICE
CERTIFICATE OF CORRECTION

PATENT : 5,901,041

DATED : May 4, 1999

INVENTOR(S) : Bill Tempest Davies and Roy Harris

It is certified that error appears in the above-identified patent and that said Letters Patent is hereby corrected as shown below:

In the drawings, Sheet 2 of 3, consisting of Figs. 4-6, should be deleted and substitute therefor the corrected drawing Sheet 2 of 3, consisting of Figs. 4-6, as shown on the attached page.

Signed and Sealed this

Twenty-first Day of March, 2000

Attest:

Q. TODD DICKINSON

Attesting Officer

Commissioner of Patents and Trademarks